(12) United States Patent
Deng et al.

(10) Patent No.: US 7,936,217 B2
(45) Date of Patent: May 3, 2011

(54) HIGH-LINEARITY COMPLEMENTARY AMPLIFIER

(75) Inventors: Junxiong Deng, San Diego, CA (US); Gurkanwal Singh Sahota, San Diego, CA (US); Solti Peng, Plano, TX (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/947,570

(22) Filed: Nov. 29, 2007

(65) Prior Publication Data

US 2009/0140812 A1  Jun. 4, 2009

(51) Int. Cl.
*H03F 3/18* (2006.01)
(52) U.S. Cl. .................................. 330/264; 330/267
(58) Field of Classification Search .......... 330/264, 330/267
See application file for complete search history.

(56) References Cited

U.S. PATENT DOCUMENTS

| 4,309,665 | A | * | 1/1982 | Yamashiro | 330/264 |
| 5,239,274 | A | * | 8/1993 | Chi | 331/57 |
| 5,568,093 | A | * | 10/1996 | Holzer | 330/264 |
| 6,828,858 | B2 | | 12/2004 | Larson et al. | |

FOREIGN PATENT DOCUMENTS

WO  WO2006013543  2/2006

OTHER PUBLICATIONS

Wang et al., "A Nonlinear Capacitance Cancellation Technique and its Application to a CMOS Class AB Power Amplifier," 2001, IEEE Radio Frequency Integrated Circuits Symposium.
Kim et al., "a 13-dB IIP3 Improved Low-Power CMOS RF Programmable Gain Amplifier Using Differential Circuit Transconductance Linearization for Various Terrestrial Mobile D-TV Applications," Jul. 2006, IEEE Journal of Solid-State Circuits, vol. 41, No. 4.
International Search Report and Written Opinion—PCT/US2008/085085, International Search Authority—European Patent Office—Mar. 17, 2009.
Shameli et al., "A Novel Power Optimization Technique for Ultra-Low Power RFICs" Low Power Electronics and Design, 2006. "ISLPED"06. Proceedings of the 2006 International Symposium on, IEEE, PI, Oct. 1, 2006, pp. 274-279, XP031115564 ISBN: 978-1-59593-462-8 p. 277, left-hand column, lines 5-18; figure 5.

(Continued)

*Primary Examiner* — Steven J Mottola
(74) *Attorney, Agent, or Firm* — Ramin Mobarhan (57) ABSTRACT

A complementary amplifier includes an NMOS transistor coupled to a PMOS transistor in a stacked configuration. The NMOS transistor and the PMOS transistor receive and amplify an input signal. The NMOS and PMOS transistors operate as a linear complementary amplifier and provide an output signal. The NMOS and PMOS transistors may have separate bias voltages, which may be selected to overlap the low-to-high and high-to-low transitions of the transconductances of these transistors. The width and length dimensions of the NMOS and PMOS transistors may be selected to match the change in input capacitance and the change in transconductance of the NMOS transistor in moderate inversion region with the change in input capacitance and the change in transconductance of the PMOS transistor in moderate inversion region. The complementary amplifier may have an approximately constant total input capacitance and an approximately constant total transconductance over a range of voltages.

25 Claims, 9 Drawing Sheets

OTHER PUBLICATIONS

Binkley et al., "Tradeoffs and Optimization in Analog CMOS Design" Mixed Design of Integrated Circuits and Systems, 2007. MIXDES 07. 14TH International Conference on, IEEE, PI, Jun. 1, 2007, pp. 47-60, XP031124345 ISBN: 978-83-922632-4-1 p. 47, left-hand column, line 2-p. 47, right-hand column, line 10 p. 54, right-hand column, line 22-p. 57, left-hand column, line 15; figures 10-12.

Shameli et al., "Ultra-Low Power RFIC Design Using Moderately Inverted MOSFETs: An Analytical/Experimental Study" Radio Frequency Integrated Circuits (RFIC) Symposium, 2006 IEEE, IEEE, Piscataway, NJ, USA, Jun. 11, 2006, pp. 470-473, XP010925174 ISBN: 978-0-7803-9572-5 the whole document.

Kang, et al., "A Highly Linear and Efficient Differential CMOS Power Amplifier with Harmonic Control" IEEE Journal of Solid-State Circuits, vol. 41, No. 6, Jun. 2006, pp. 1314-1322.

* cited by examiner

HIGH-LINEARITY COMPLEMENTARY AMPLIFIER

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless device such as a cellular phone may include a transmitter and a receiver for bi-directional communication. The transmitter may utilize a power amplifier (PA), the receiver may utilize a low noise amplifier (LNA), and the transmitter and receiver may utilize variable gain amplifiers (VGAs).

To reduce cost and improve integration, sub-micron complementary metal oxide semiconductor (CMOS) fabrication processes are commonly used for radio frequency (RF) circuits in wireless devices and other applications. Unfortunately, transistors become more nonlinear in sub-micron CMOS processes. Furthermore, shrinking physical dimensions of transistors due to continual improvement in CMOS fabrication technology place demanding reliability requirements on amplifiers fabricated with deep sub-micron CMOS processes. There is therefore a need in the art for an amplifier with good linearity and reliability.

SUMMARY

A complementary amplifier that can be fabricated in sub-micron CMOS processes and having good linearity and reliability is described herein. The complementary amplifier is suitable for use in applications with stringent linearity requirements such as modern wireless communication systems.

In one design, the complementary amplifier includes an N-channel metal oxide semiconductor (NMOS) transistor coupled to a P-channel metal oxide semiconductor (PMOS) transistor in a stacked configuration. The NMOS transistor receives and amplifies an input signal. The PMOS transistor also receives and amplifies the input signal. The NMOS and PMOS transistors operate as a linear complementary amplifier and provide an output signal.

The NMOS and PMOS transistors may have separate bias voltages. The gate of the NMOS transistor may be biased with a first bias voltage, and the gate of the PMOS transistor may be biased (e.g., self-biased) with a second bias voltage. The NMOS and PMOS transistors may be biased such that a low-to-high transition of the transconductance of the NMOS transistor overlaps a high-to-low transition of the transconductance of the PMOS transistor.

The areas of the NMOS and PMOS transistors may be selected to match the change in input capacitance of the NMOS transistor in moderate inversion region with the change in input capacitance of the PMOS transistor in moderate inversion region. The sizes (or width to length ratios) of the NMOS and PMOS transistors may be selected to match the change in transconductance of the NMOS transistor in moderate inversion region with the change in transconductance of the PMOS transistor in moderate inversion region. The complementary amplifier may thus have an approximately constant total input capacitance as well as an approximately constant total transconductance for the NMOS and PMOS transistors over a range of voltages for the input signal. The constant total input capacitance and the constant total transconductance may improve the linearity of the complementary amplifier.

Various aspects and features of the disclosure are described in further detail below.

DETAILED DESCRIPTION

The complementary amplifier described herein may be used for various electronics devices such as cellular phones, personal digital assistants (PDAs), handheld devices, wireless modems, laptop computers, cordless phones, Bluetooth devices, consumer electronics devices, etc. For clarity, the use of the complementary amplifier in a wireless device, which may be a cellular phone or some other device, is described below.

Figure 1:
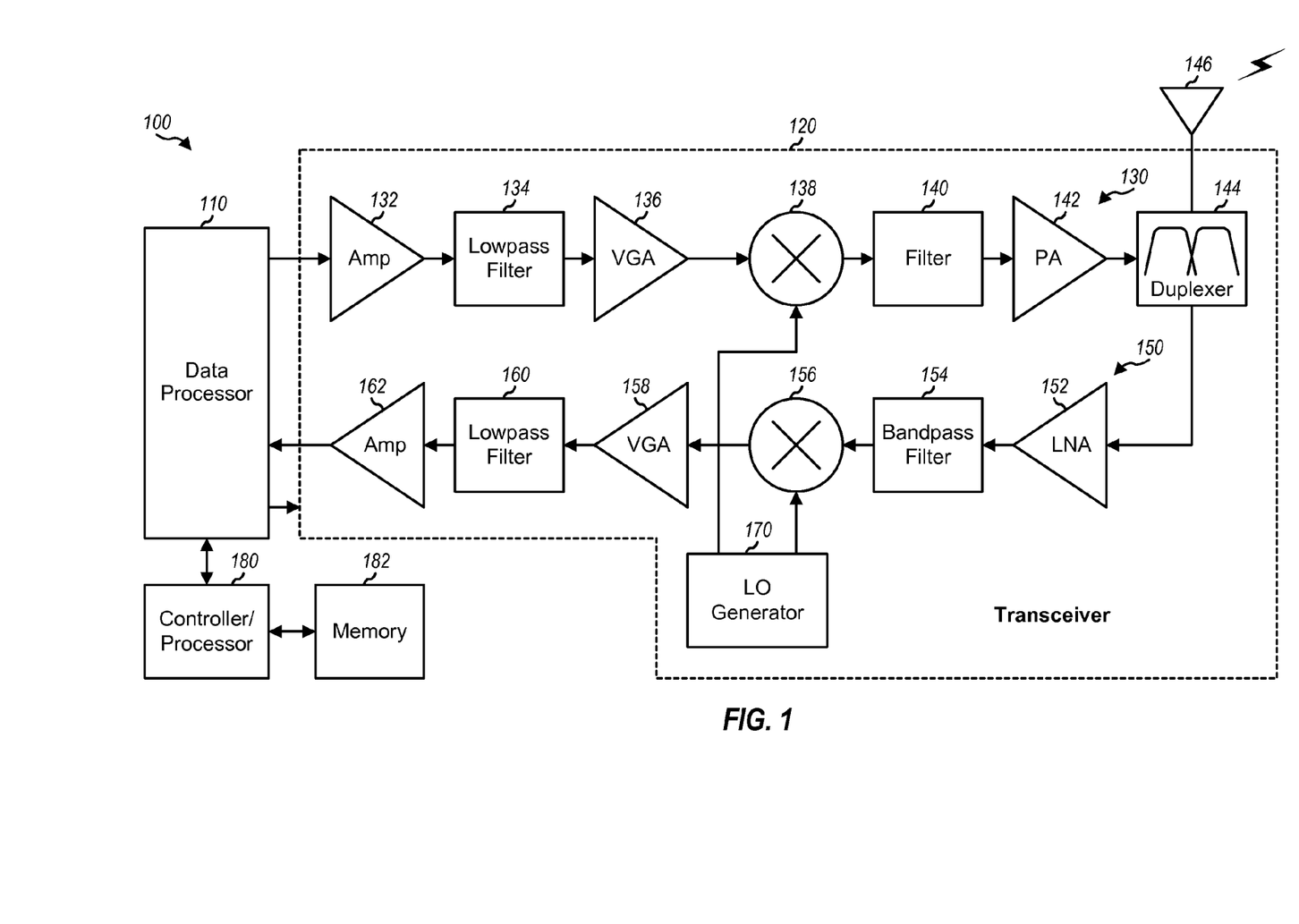
FIG. 1 shows a block diagram of a wireless device.

FIG. 1 shows a block diagram of a design of a wireless device 100. In this design, wireless device 100 includes a data processor 110, a transceiver 120, a controller/processor 180, and a memory 182. Transceiver 120 includes a transmitter 130 and a receiver 150 that support bi-directional wireless communication. In general, wireless device 100 may include any number of transmitters and any number of receivers for any number of communication systems and frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to RF by a mixer 138. The upconverted signal is filtered by a bandpass filter 140 to remove images caused by the frequency upconversion, further amplified by a power amplifier (PA) 142, routed through a duplexer 144, and transmitted via an antenna 146.

In the receive path, antenna 146 receives downlink signals from base stations and provides a received signal, which is routed through duplexer 144 and presented to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. An LO generator 170 generates a transmit LO signal for frequency upconversion and provides the transmit LO signal to mixer 138. LO generator 170 also generates a receive LO signal for frequency downconversion and provides the receive LO signal to mixer 156.

FIG. 1 shows an example transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

Controller/processor 180 may control the operation of wireless device 100. Memory 182 may store program codes and data for wireless device 100. Data processor 110, controller/processor 180, and/or memory 182 may be implemented on one or more application specific integrated circuits (ASICs) and/or other ICs.

As shown in FIG. 1, a transmitter and a receiver may include various amplifiers. Each amplifier may be implemented with various designs. Each amplifier may have certain requirements related to linearity and/or other parameters.

Figure 2:
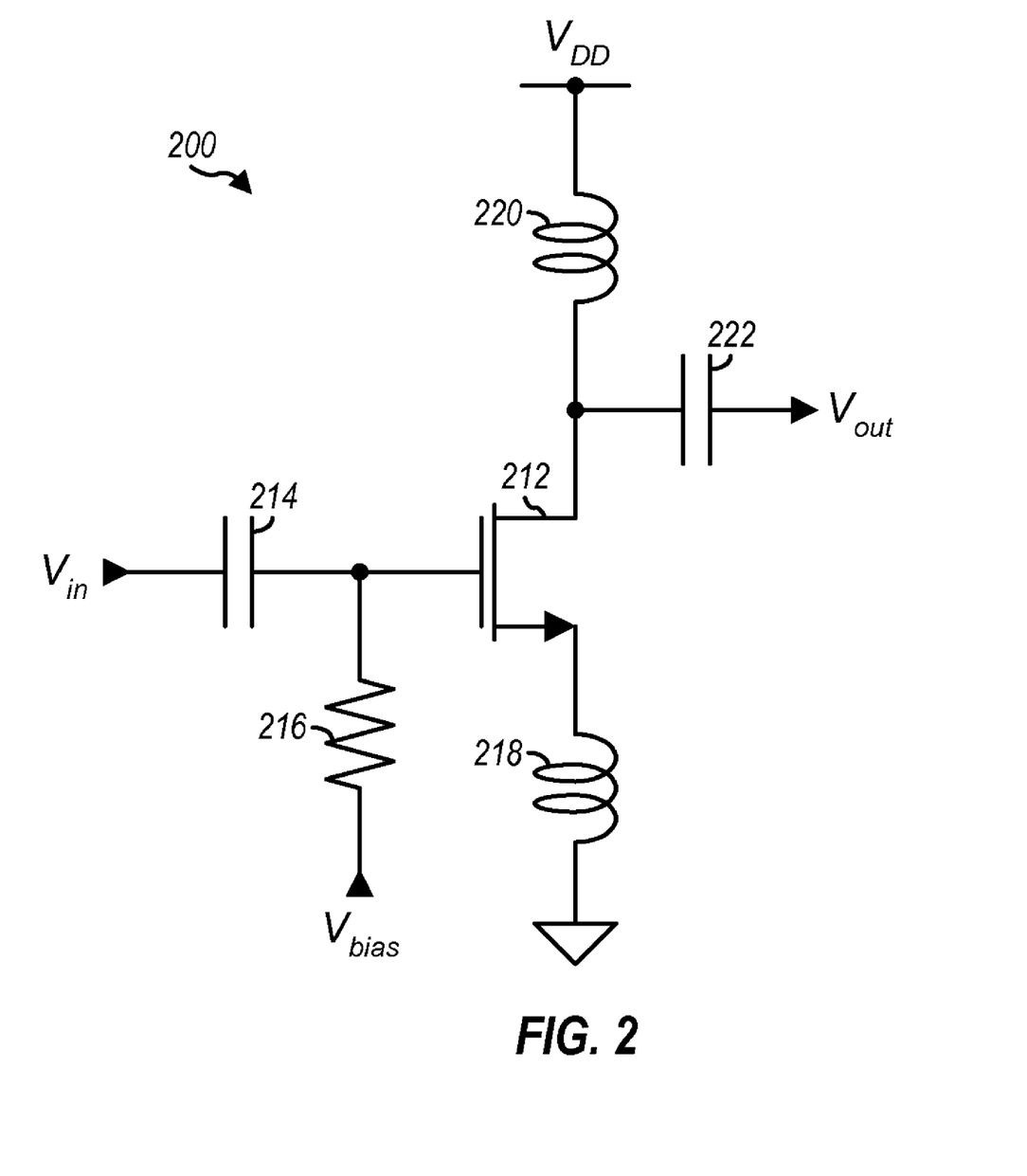
FIG. 2 shows a schematic diagram of an amplifier with a passive load.

FIG. 2 shows a schematic diagram of an amplifier 200 with a passive load. Amplifier 200 may be used for LNA 152, PA 142, and/or other amplifiers in FIG. 1. Within amplifier 200, an NMOS transistor 212 has its source coupled to one end of an inductor 218 and its drain coupled to one end of an inductor 220. The other end of inductor 218 is coupled to circuit ground. The other end of inductor 220 is coupled to a power supply $V_{DD}$. A capacitor 214 has one end coupled to the gate of NMOS transistor 212 and the other end receiving an input signal $V_{in}$. A resistor 216 has one end coupled to the gate of NMOS transistor 212 and the other end receiving a bias voltage $V_{bias}$. A capacitor 222 has one end coupled to the drain of NMOS transistor 212 and the other end providing an output signal $V_{out}$.

NMOS transistor 212 provides signal amplification for the input signal $V_{in}$. The bias voltage $V_{bias}$ and the size of NMOS transistor 212 may be selected to achieve the desired gain and linearity for amplifier 200. Capacitor 214 provides AC coupling. Inductor 218 provides source degeneration for NMOS transistor 212, which may improve the linearity of amplifier 200. Inductor 218 may also provide an impedance match looking into the gate of NMOS transistor 212. Inductor 218 may be included if amplifier 200 is used for an LNA and may be omitted for other types of amplifier. Inductor 220 and capacitor 222 may form an output impedance matching circuit for amplifier 200. The values of inductor 220 and/or capacitor 222 may be selected to achieve the desired impedance over a frequency range of interest.

A MOS transistor, which may be an NMOS transistor or a PMOS transistor, has several sources of nonlinearity. To achieve good linearity for an amplifier, these sources of nonlinearity for the MOS transistor should be addressed.

Figure 3:
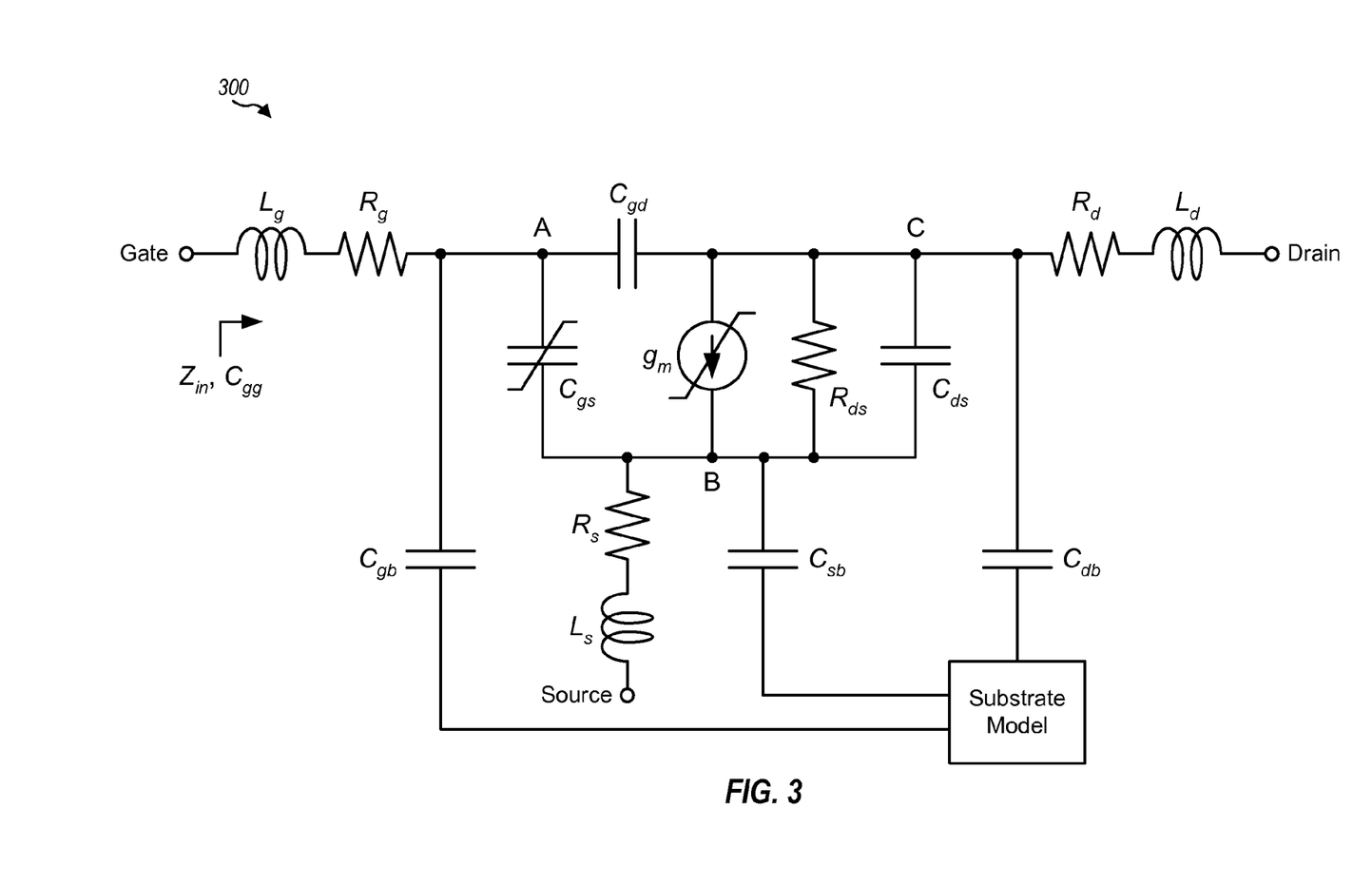
FIG. 3 shows a schematic diagram of a model of a MOS transistor.

FIG. 3 shows a schematic diagram of a model 300 of a MOS transistor. An inductor with a value of $L_g$ and a resistor with a value of $R_g$ are coupled in series and between the gate of the MOS transistor and a node A. An inductor with a value of $L_s$ and a resistor with a value of $R_s$ are coupled in series and between the source of the MOS transistor and a node B. An inductor with a value of $L_d$ and a resistor with a value of $R_d$ are coupled in series and between the drain of the MOS transistor and a node C. A gate-to-source capacitor with a value of $C_{gs}$ is coupled between nodes A and B. A controlled current source with a gain of $g_m$, a drain-to-source resistor with a value of $R_{ds}$, and a drain-to-source capacitor with a value of $C_{ds}$ are coupled in parallel and between nodes B and C. A gate-to-drain capacitor with a value of $C_{gd}$ is coupled between nodes A and C. Capacitors with values of $C_{gb}$, $C_{sb}$ and $C_{db}$ are coupled between nodes A, B and C, respectively, and a substrate. The $C_{gs}$ capacitance may be much larger than the $C_{gd}$ and $C_{gb}$ capacitances when the MOS transistor is turned on. Hence, the input capacitance $C_{gg}$ looking into the gate of the MOS transistor may be dominated by the $C_{gs}$ capacitance. The input impedance $Z_{in}$ is the impedance looking into the gate of the MOS transistor.

As shown in FIG. 3, there may be many parasitic capacitors, inductors, and resistors in a MOS transistor. However, the main sources of nonlinearity are the $C_{gs}$ capacitance and the transconductance $g_m$, both of which vary with a gate-to-source voltage $V_{gs}$. $C_{gs}$ is nonlinear in that its value is dependent on $V_{gs}$ and hence $V_{in}$. It is desirable to have $C_{gs}$ be linear or independent of $V_{in}$. Similarly, $g_m$ is nonlinear in that its value is dependent on $V_{gs}$ and hence $V_{in}$. It is also desirable to have $g_m$ be linear or independent of $V_{in}$. Improved linearity may be achieved for an amplifier by linearizing both $C_{gs}$ and $g_m$ of the MOS transistor.

Figure 4A:
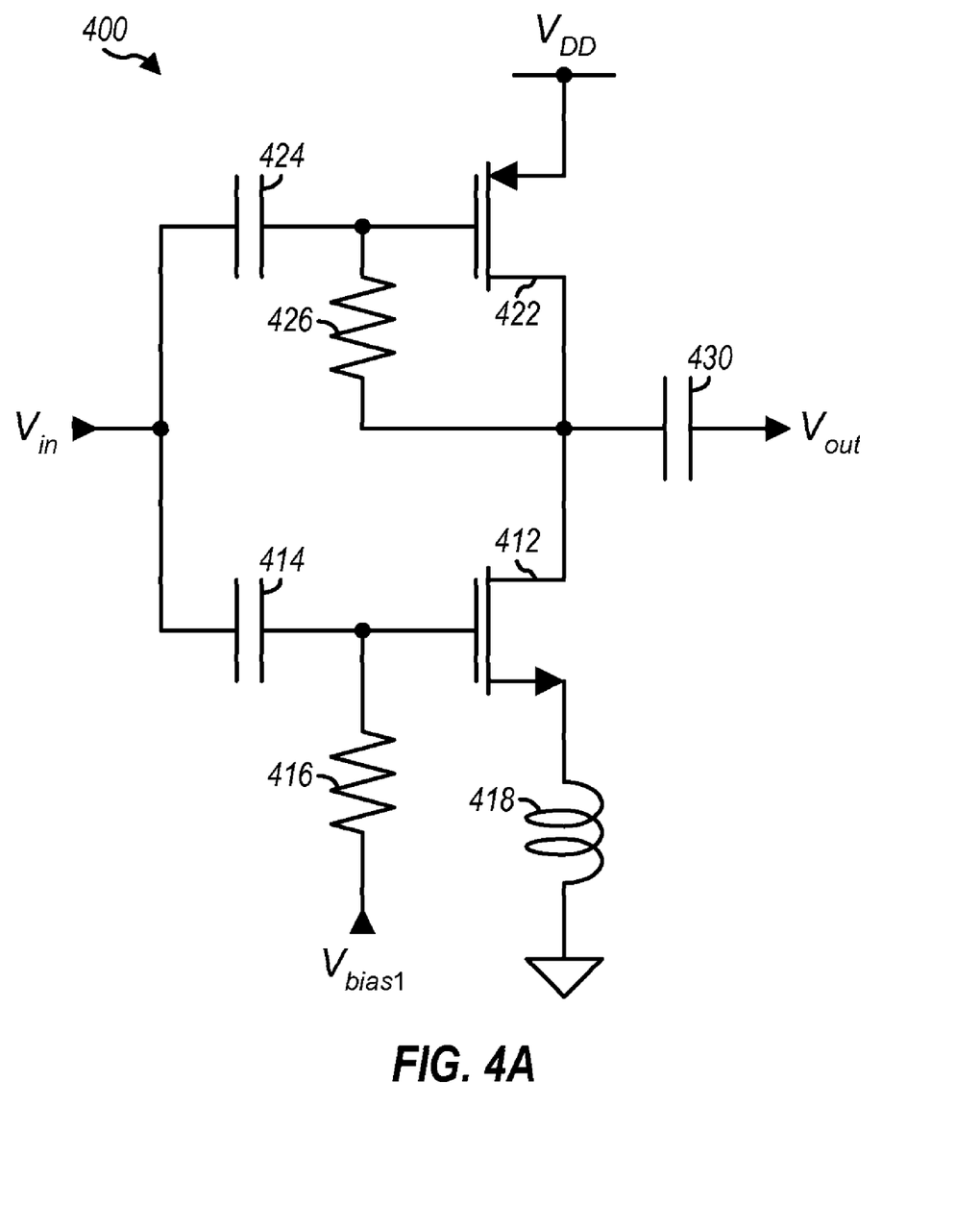
FIGS. 4A and 4B show schematic diagrams of two complementary amplifiers.

FIG. 4A shows a schematic diagram of a complementary amplifier 400 with good linearity. Amplifier 400 may be used for LNA 152, PA 142, mixer 156 if implemented as a transconductance stage of an active mixer, and/or other amplifiers and active circuits in FIG. 1. Within amplifier 400, an NMOS transistor 412, a capacitor 414, a resistor 416, and an inductor 418 are coupled in the same manner as NMOS transistor 212, capacitor 214, resistor 216, and inductor 218 in FIG. 2. A PMOS transistor 422 has its source coupled to a power supply $V_{DD}$ and its drain coupled to the drain of NMOS transistor 412. A capacitor 424 has one end coupled to the gate of PMOS transistor 422 and the other end receiving an input signal $V_{in}$. A resistor 426 is coupled between the gate and drain of PMOS transistor 422. A capacitor 430 has one end coupled to the drains of the NMOS and PMOS transistors and the other end providing an output signal $V_{out}$.

NMOS transistor 412 and PMOS transistor 422 provide signal amplification for the input signal $V_{in}$. NMOS transistor 412 has a transconductance of $g_{m1}$ and a gate-to-source capacitance of $C_{gs1}$. PMOS transistor 422 has a transconductance of $g_{m2}$ and a gate-to-source capacitance of $C_{gs2}$. The gate of NMOS transistor 412 is biased with a bias voltage of $V_{bias1}$ via resistor 416. $V_{bias1}$ may be selected to bias NMOS transistor 412 in a low or moderate transconductance region in order to achieve both good $g_{m1}$ and low power consumption. The gate of PMOS transistor 422 is self-biased with a bias voltage of $V_{bias2}$ via resistor 426. $V_{bias2}$ is equal to the drain voltage $V_d$ of PMOS transistor 422. $V_d$ may be set to a desired value by selecting a proper bias current for transistors 412 and 422, a proper device size for NMOS transistor 412, and a proper device size for PMOS transistor 422.

For amplifier 400, NMOS transistor 412 and PMOS transistor 422 may be biased separately with bias voltages $V_{bias1}$ and $V_{bias2}$, respectively. This is different from a conventional CMOS inverter, which has the gates of the NMOS and PMOS transistors tied together and thus share the same bias voltage. The bias voltage $V_{bias1}$ and the width and length dimensions of NMOS transistor 412 and the bias voltage $V_{bias2}$ and the width and length dimensions of PMOS transistor 422 may be selected to achieve the desired gain and linearity for amplifier 400, as described below. Capacitors 414 and 424 provide AC coupling for the input signal $V_{in}$. Inductor 418 provides source degeneration for NMOS transistor 412 and may also provide an input impedance match. Capacitor 430 provides AC coupling for the output signal $V_{out}$.

Figure 4B:
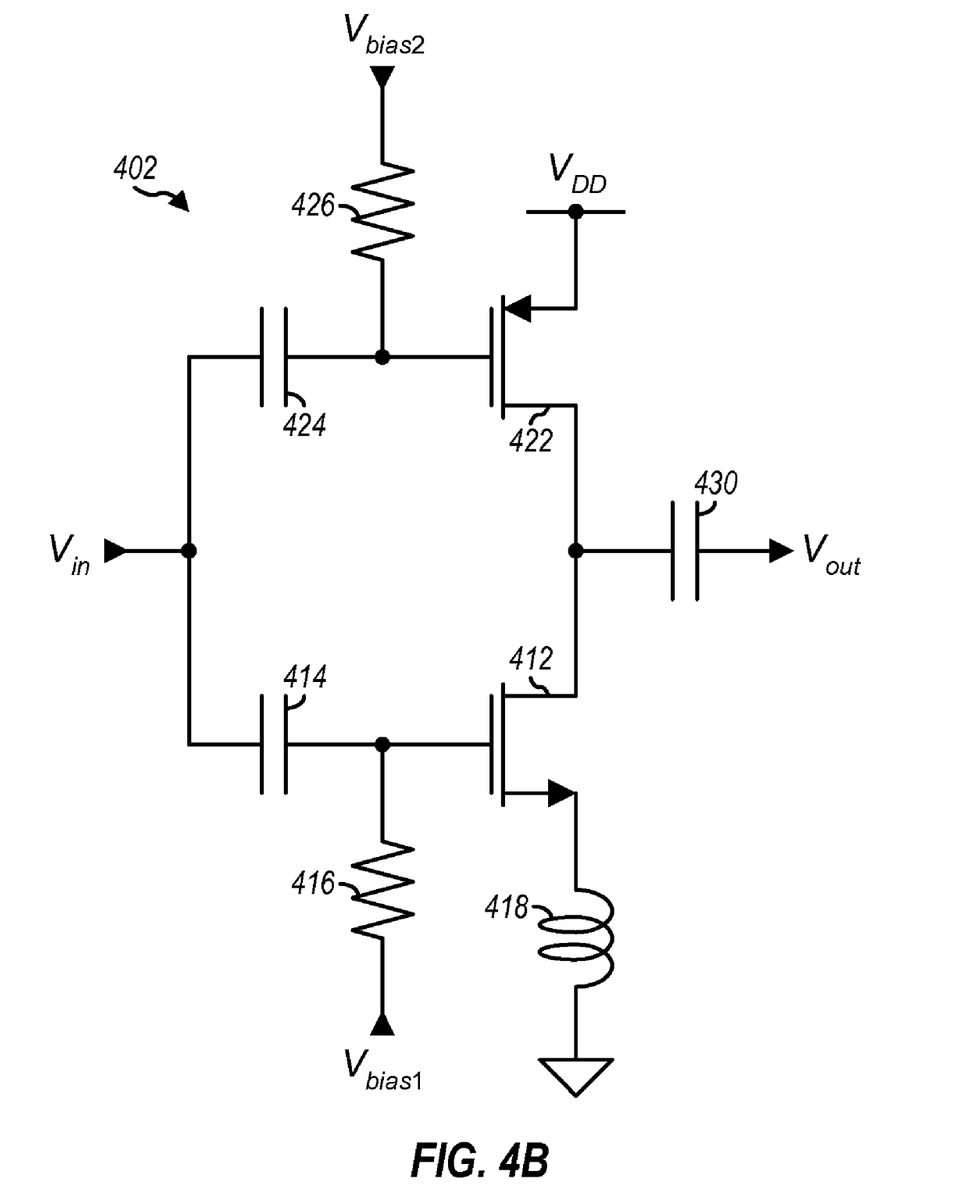

FIG. 4B shows a schematic diagram of a complementary amplifier 402 with good linearity. Amplifier 402 includes all of the circuit elements in amplifier 400 in FIG. 4A. However, resistor 426 has one end coupled to the gate of PMOS transistor 422 and the other end receiving a bias voltage of $V_{bias2}$. The design shown in FIG. 4B allows NMOS transistor 412 and PMOS transistor 422 to be independently biased with external bias voltages $V_{bias1}$ and $V_{bias2}$, respectively.

In the designs shown in FIGS. 4A and 4B, NMOS transistor 412 and PMOS transistor 422 are complementary and receive the same input signal $V_{in}$. Hence, when one MOS transistor is turned on harder by the input signal $V_{in}$, the other MOS transistor is turned on less hard by the same input signal $V_{in}$. $C_{gs1}$ and $g_{m1}$ of NMOS transistor 412 vary in a complementary manner to $C_{gs2}$ and $g_{m2}$ of PMOS transistor 422. The total input capacitance $C_{in}$ observed by the input signal $V_{in}$ is equal to the input capacitance $C_{gg1}$ of NMOS transistor 412 plus the input capacitance $C_{gg2}$ of PMOS transistor 422, where $C_{gg1}$ and $C_{gg2}$ are mostly due to $C_{gs1}$ and $C_{gs2}$, respectively. Since NMOS transistor 412 and PMOS transistor 422 are complementary, a more linear total input capacitance $C_{in}$ may be obtained by combining $C_{gg1}$ of NMOS transistor 412 and $C_{gg2}$ of PMOS transistor 422. The total transconductance $g_{total}$ for amplifier 400 or 402 is determined by $g_{m1}$ of NMOS transistor 412 and $g_{m2}$ of PMOS transistor 422. A more linear total transconductance $g_{total}$ total may be obtained by combining $g_{m1}$ of NMOS transistor 412 and $g_{m2}$ of PMOS transistor 422. Amplifiers 400 and 402 can thus achieve linearization of both the total input capacitance $C_{in}$ and the total transconductance $g_{total}$.

A MOS transistor may have three operating regions. A weak inversion (or sub-threshold) region may cover a range of small $V_{gs}$ voltages. A moderate inversion region may cover a range of $V_{gs}$ voltages near a threshold voltage $V_{th}$ of the MOS transistor. A strong inversion region may cover a range of large $V_{gs}$ voltages.

Figure 5A:
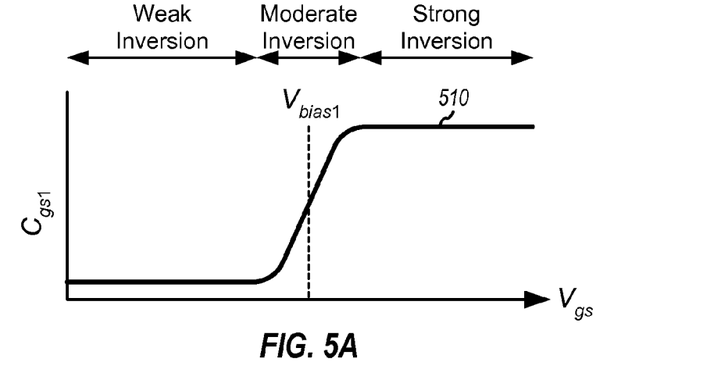
FIG. 5A shows a plot of input capacitance of an NMOS transistor.

FIG. 5A shows a plot 510 of $C_{gs1}$ versus $V_{gs}$ for NMOS transistor 412 for a specific bias voltage $V_{bias1}$. As indicated by plot 510, $C_{gs1}$ is relatively low for low $V_{gs}$ voltages, changes rapidly near the bias voltage $V_{gs} \approx V_{bias1}$, and increases slowly after the bias voltage.

Figure 5B:
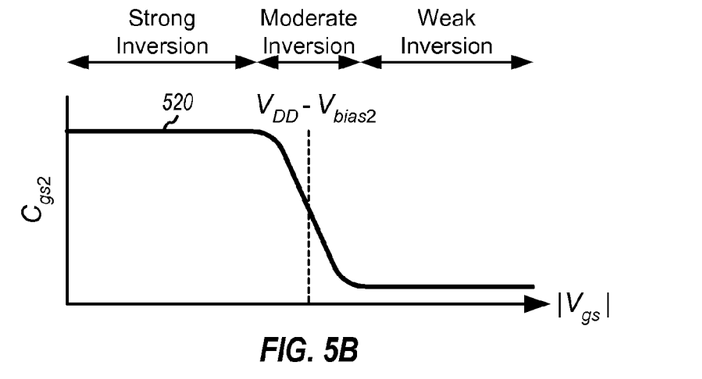
FIG. 5B shows a plot of input capacitance of a PMOS transistor.

FIG. 5B shows a plot 520 of $C_{gs2}$ versus $|V_{gs}|$ for PMOS transistor 422 for a specific bias voltage $V_{bias2}$. As indicated by plot 520, $C_{gs2}$ is relatively high for low $|V_{gs}|$ voltages, changes rapidly near the bias voltage, and decreases slowly after the bias voltage.

Figure 5C:
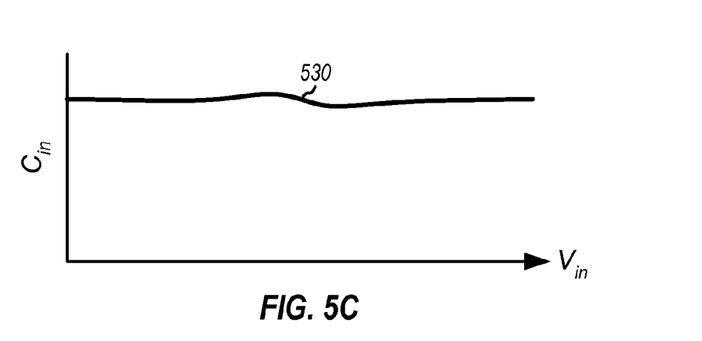
FIG. 5C shows a plot of total input capacitance for the NMOS and PMOS transistors.

FIG. 5C shows a plot 530 of the total input capacitance $C_{in}$ for both NMOS transistor 412 and PMOS transistor 422 versus $V_{in}$. $C_{in}$ is dominated by $C_{gs2}$ of PMOS transistor 422 at low $V_{in}$ voltages and dominated by $C_{gs1}$ of NMOS transistor 412 at high $V_{in}$ voltages. $C_{in}$ may be kept approximately constant by combining $C_{gs1}$ of NMOS transistor 412 and $C_{gs2}$ of PMOS transistor 422. The bias voltages and/or the dimensions of NMOS transistor 412 and PMOS transistor 422 may be selected such that $C_{in}$ is as constant as possible over the entire range of $V_{in}$.

Figure 6A:
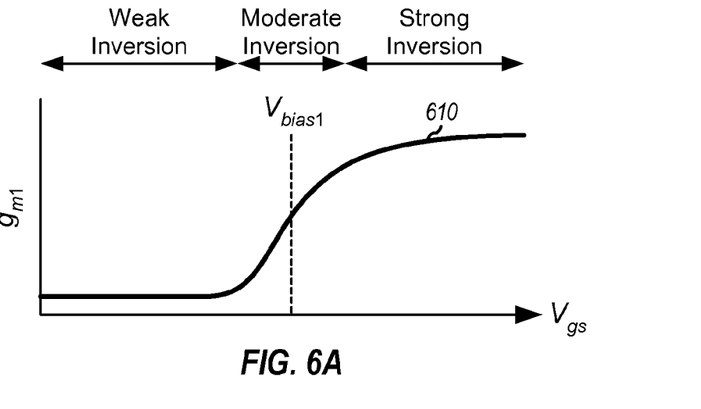
FIG. 6A shows a plot of transconductance of the NMOS transistor.

FIG. 6A shows a plot 610 of $g_{m1}$ versus $V_{gs}$ for NMOS transistor 412 for a specific bias voltage $V_{bias1}$ and specific width and length dimensions for NMOS transistor 412. As indicated by plot 610, $g_{m1}$ is small for low $V_{gs}$ voltages, changes rapidly near the bias voltage $V_{gs} \approx V_{bias1}$, and approaches a maximum value after the bias voltage.

Figure 6B:
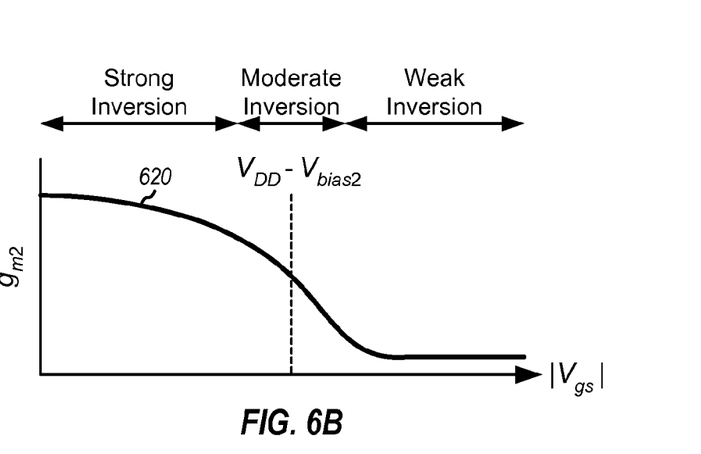
FIG. 6B shows a plot of transconductance of the PMOS transistor.

FIG. 6B shows a plot 620 of $g_{m2}$ versus $|V_{gs}|$ for PMOS transistor 422 for a specific bias voltage $V_{bias2}$ and specific width and length dimensions for PMOS transistor 422. As indicated by plot 620, $g_{m2}$ is near the maximum value for low $|V_{gs}|$ voltages, changes rapidly near the bias voltage, and approaches zero after the bias voltage.

As shown in plots 610 and 620, $g_{m1}$ and $g_{m2}$ have large transitions from weak inversion (small $V_{gs}$) to strong inversion (large $V_{gs}$). However, $g_{m1}$ and $g_{m2}$ do not vary much with large gate overdrive (or large $V_{gs}$). Good linearity may be obtained by operating each MOS transistor with large gate overdrive. However, this would result in high current consumption. The gate bias voltages for NMOS transistor 412 and PMOS transistor 422 may be set to suitable values such that $g_{m1}$ and $g_{m2}$ of the two transistors can be combined to obtain a relatively flat region of total transconductance versus $V_{gs}$ with low current consumption.

Figure 6C:
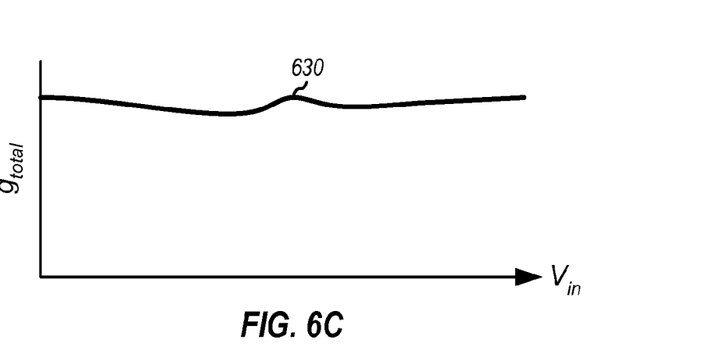
FIG. 6C shows a plot of total transconductance for the NMOS and PMOS transistors.

FIG. 6C shows a plot 630 of the total transconductance $g_{total}$ for both NMOS transistor 412 and PMOS transistor 422 versus $V_{in}$. $g_{total}$ is dominated by $g_{m2}$ of PMOS transistor 422 at low $V_{in}$ voltages and dominated by $g_{m1}$ of NMOS transistor 412 at high $V_{in}$ voltages. A relatively constant total transconductance $g_{total}$ may be obtained by combining $g_{m1}$ and $g_{m2}$ of the two MOS transistors operating at different bias regions, e.g., saturation and sub-threshold. $g_{total}$ may be kept approximately constant by compensating for the nonlinear $g_{m1}$ of NMOS transistor 412 with the nonlinear $g_{m2}$ of PMOS transistor 422. The bias voltages and/or the dimensions of NMOS transistor 412 and PMOS transistor 422 may be selected such that the change in $g_{m1}$ for NMOS transistor 412 matches the change in $g_{m2}$ for PMOS transistor 422.

Linearization of both $C_{in}$ and $g_{total}$ over a range of $V_{in}$ voltages may be achieved simultaneously by selecting appropriate width and length dimensions for NMOS transistor 412 and PMOS transistor 422, as follows:

$$W_p \cdot L_p = \mu \cdot W_n \cdot L_n, \text{ for } C_{in} \text{ linearization, and} \qquad \text{Eq (1)}$$

$$\frac{W_p}{L_p} = M \cdot \frac{W_n}{L_n}, \text{ for } g_{total} \text{ linearization,} \qquad \text{Eq (2)}$$

where $W_n$ and $L_n$ are the width and length, respectively, of NMOS transistor 412, $W_p$ and $L_p$ are the width and length, respectively, of PMOS transistor 422, μ is a ratio of the PMOS transistor area to the NMOS transistor area, and M is a ratio of the PMOS transistor size to the NMOS transistor size.

The area of a MOS transistor is equal to its width times its length. The size of a MOS transistor is equal to its width divided by its length.

Equation (1) ensures that NMOS transistor 412 and PMOS transistor 422 have the same or similar areas, so that the change in input capacitance of PMOS transistor 422 at moderate inversion is approximately equal to the change in input capacitance of NMOS transistor 412 at moderate inversion, or $\Delta C_{gs1} \approx \Delta C_{gs2}$. This may then result in approximately constant total input capacitance $C_{in}$ over the voltage swing of the input signal $V_{in}$. $\mu$ may be equal to 1.0, in which case NMOS transistor 412 and PMOS transistor 422 have the same area. $\mu$ may also be equal to a value close to 1.0.

Equation (2) selects the size $W_p/L_p$ of PMOS transistor 422 to be M times the size $W_n/L_n$ of NMOS transistor 412 so that the change in $g_{m2}$ of PMOS transistor 422 at moderate inversion is approximately equal to the change in $g_{m1}$ of NMOS transistor 412 at moderate inversion, or $\Delta g_{m1} \approx \Delta g_{m2}$. In general, the $g_m$ of a PMOS transistor is smaller than the $g_m$ of an NMOS transistor for a given device size. The $g_m$ of a MOS transistor increases with larger device size. Hence, the size of PMOS transistor 422 may be selected to be M times the size of NMOS transistor 412, where M>1, so that the change in $g_{m2}$ of PMOS transistor 422 is approximately equal to the change in $g_{m1}$ of NMOS transistor 412, and $g_{total}$ is kept approximately constant. M may be equal to four or some other value.

As shown in equations (1) and (2), there are two equations and four variables for the width and length dimensions of the NMOS and PMOS transistors. Thus, various values may be used for $W_n$, $L_n$, $W_p$ and $L_p$. In one specific design, $\mu=1$, M=4, $W_n=50$ $\mu$m, $L_n=0.36$ $\mu$m, $W_p=100$ $\mu$m, and $L_p=0.18$ $\mu$m. Other values may also be used for $W_n$, $L_n$, $W_p$ and $L_p$.

The bias voltage $V_{bias1}$ determines the region of rapid changes in $C_{gs1}$ and $g_{m1}$ of NMOS transistor 412, e.g., as shown in FIGS. 5A and 6A. This region may be shifted left or right by adjusting the bias voltage $V_{bias1}$. The bias voltage $V_{bias2}$ for PMOS transistor 422 determines the region of rapid changes in $C_{gs2}$ and $g_{m2}$ of the PMOS transistor, e.g., as shown in FIGS. 5B and 6B. This region may be shifted left or right by adjusting the bias voltage $V_{bias2}$. The bias voltages $V_{bias1}$ and $V_{bias2}$ may be selected such that the total input capacitance $C_{in}$ and the total transconductance $g_{total}$ for NMOS transistor 412 and PMOS transistor 422 are as constant as possible over the voltage swing of the input signal $V_{in}$. Constant $g_{total}$ may be achieved when the slope of $g_{m2}$ for PMOS transistor 422 is opposite the slope of $g_{m1}$ for NMOS transistor 412.

Figure 7:
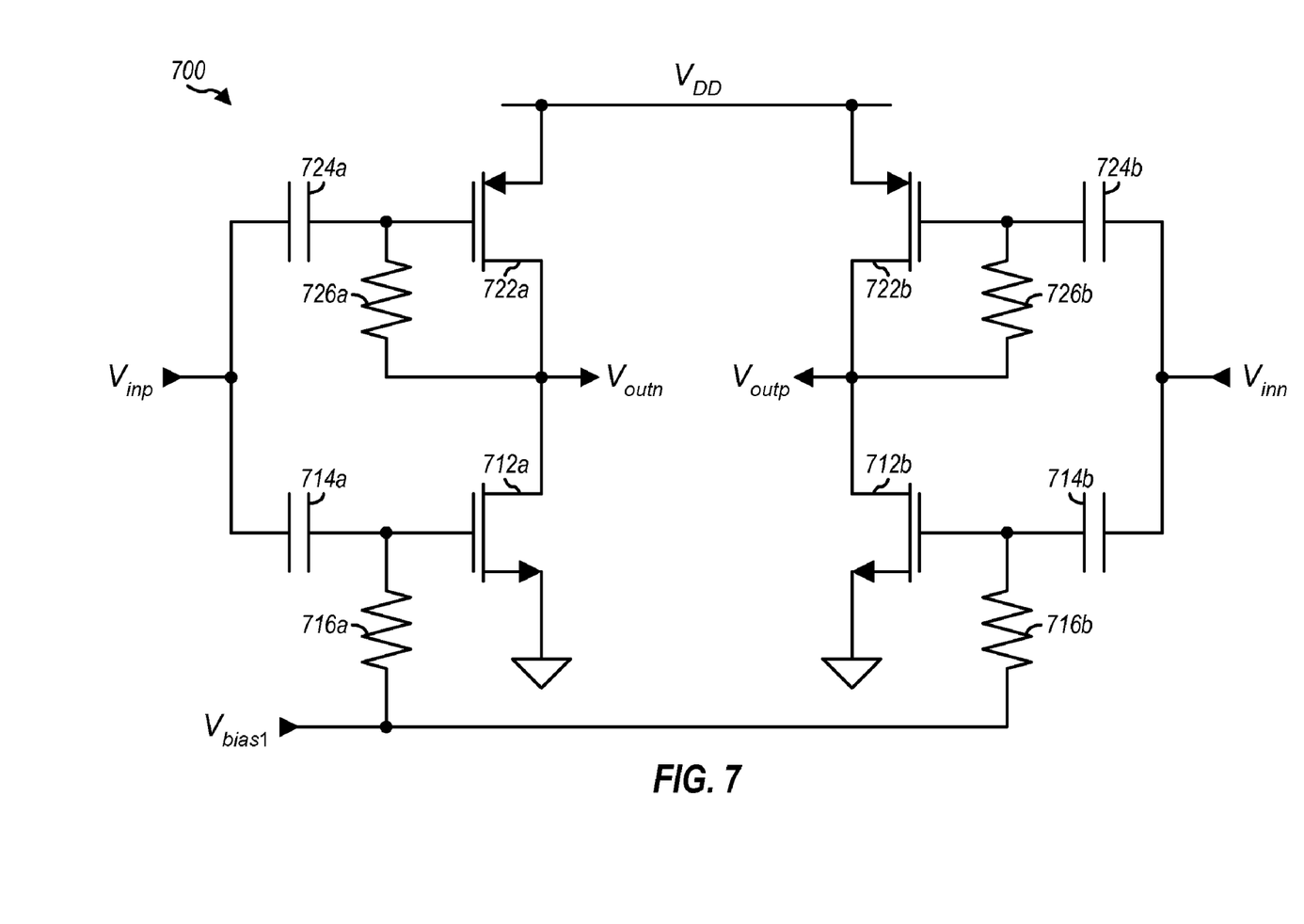
FIG. 7 shows a schematic diagram of a differential complementary amplifier.

FIG. 7 shows a schematic diagram of a design of a differential complementary amplifier 700 with good linearity. Amplifier 700 may also be used for LNA 152 and/or other amplifiers in FIG. 1. Within amplifier 700, NMOS transistors 712a and 712b have their sources coupled to circuit ground and their drains providing complementary output signals $V_{outn}$ and $V_{outp}$, respectively. Resistors 716a and 716b have one end coupled to the gate of NMOS transistors 712a and 712b, respectively, and the other end receiving a bias voltage $V_{bias1}$. PMOS transistors 722a and 722b have their sources coupled to the power supply $V_{DD}$ and their drains coupled to the drains of NMOS transistors 712a and 712b, respectively. A resistor 726a is coupled between the gate and drain of PMOS transistor 722a, and a resistor 726b is coupled between the gate and drain of PMOS transistor 722b. Capacitors 714a and 724a have one end coupled to the gate of transistors 712a and 722a, respectively, and the other end receiving a first input signal $V_{inp}$. Capacitors 714b and 724b have one end coupled to the gate of transistors 712b and 722b, respectively, and the other end receiving a second input signal $V_{inn}$. A differential input signal $V_{in}$ is formed by the complementary $V_{inp}$ and $V_{inn}$ signals, or $V_{in}=V_{inn}-V_{inp}$. A differential output signal $V_{out}$ is formed by the complementary $V_{outp}$ and $V_{outn}$ signals, or $V_{out}=V_{outp}-V_{outn}$.

NMOS transistors 712a and 712b and PMOS transistors 722a and 722b provide signal amplification for the input signal $V_{in}$. The gates of NMOS transistors 712a and 712b are biased with the bias voltage $V_{bias1}$ via resistors 716a and 716b. The gates of PMOS transistors 722a and 722b are self-biased with a bias voltage $V_{bias2}$ via resistors 726a and 726b. The bias voltage $V_{bias1}$ and the dimensions of NMOS transistors 712a and 712b and the bias voltage $V_{bias2}$ and the dimensions of PMOS transistors 722a and 722b may be selected to achieve the desired gain and linearity for amplifier 700, as described above for amplifiers 400 and 402 in FIGS. 4A and 4B, respectively. Capacitors 714a, 714b, 724a and 724b provide AC coupling for the complementary input signals $V_{inp}$ and $V_{inp}$.

Figure 8:
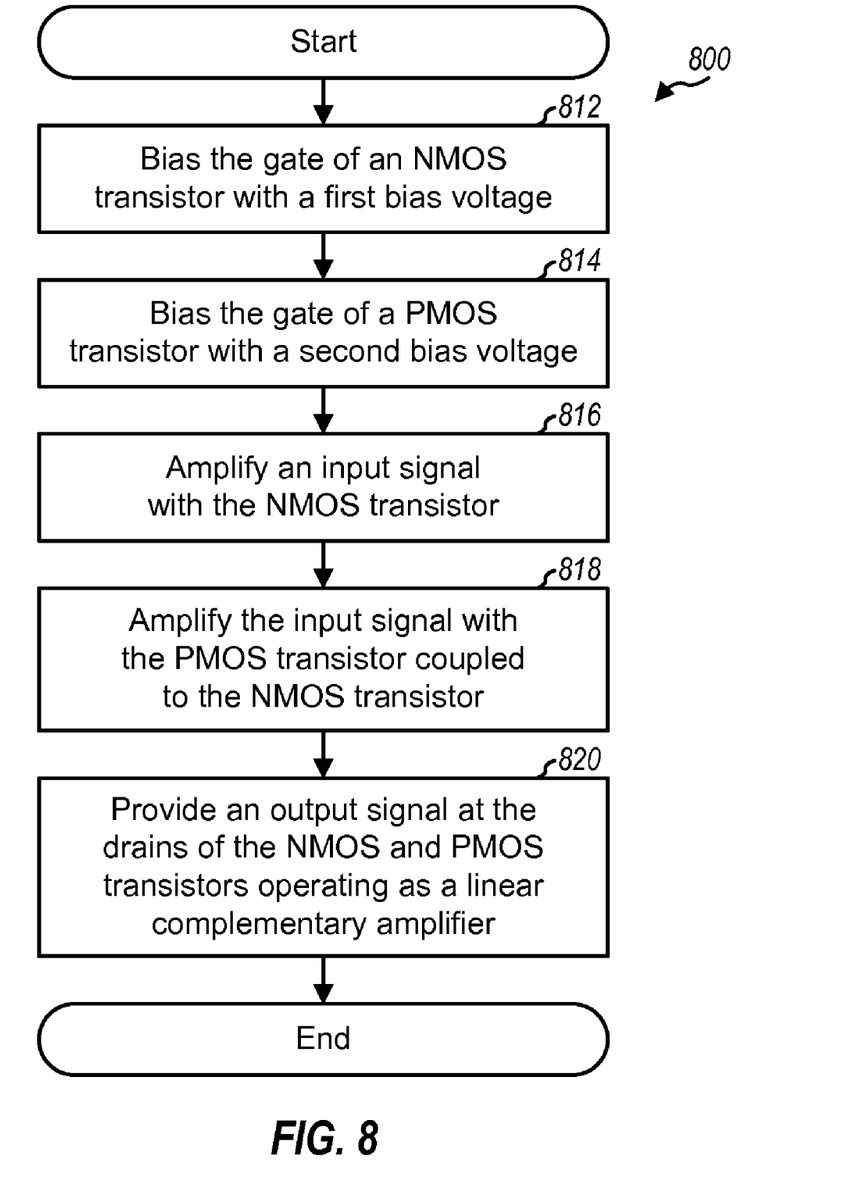
FIG. 8 shows a process for amplifying a signal.

FIG. 8 shows a design of a process 800 for amplifying a signal. The gate of an NMOS transistor may be biased with a first bias voltage (block 812). The gate of a PMOS transistor may be biased with a second bias voltage (block 814). An input signal may be amplified with the NMOS transistor (block 816). The input signal may also be amplified with the PMOS transistor coupled to the NMOS transistor (block 818). An output signal may be provided at the drains of the NMOS and PMOS transistors, which may be operated as a linear complementary amplifier (block 820).

The NMOS and PMOS transistors may be biased to overlap a low-to-high transition of the transconductance of the NMOS transistor with a high-to-low transition of the transconductance of the PMOS transistor. The width and length dimensions of the NMOS and PMOS transistors may be selected to match the change in input capacitance of the NMOS transistor in moderate inversion region with the change in input capacitance of the PMOS transistor in moderate inversion region. The sizes of the NMOS and PMOS transistors may be selected to match the change in transconductance of the NMOS transistor in moderate inversion region with the change in transconductance of the PMOS transistor in moderate inversion region.

FIGS. 4A, 4B and 7 show example designs of single-ended and differential complementary amplifiers with good linearity. A complementary amplifier may also be implemented with other designs, e.g., with different types of transistor, different biasing schemes, different arrangement of passive circuit elements, etc. The complementary amplifiers shown in FIGS. 4A, 4B and 7 may each be used as a gain stage of a multi-stage amplifier having one or more gain stages, one or more buffer stages, one or more filter stages, etc.

The complementary amplifier described herein may provide one or more of the following advantages:
  Improved linearity for the amplifier via simultaneous linearization of the total input capacitance $C_{in}$ and the total transconductance $g_{total}$ to obtain approximately constant $C_{in}$ and $g_{total}$ over the input signal swing,
  Higher total transconductance $g_{total}$ by combining the transconductances of the NMOS and PMOS transistors,
  Lower power consumption by biasing the NMOS and PMOS transistor at lower DC bias levels to reduce power consumption while achieving good $g_{total}$, and
  Improved reliability in deep sub-micron CMOS processes through use of stacked NMOS and PMOS transistors (instead of a single NMOS transistor).

The complementary amplifier described herein may be implemented on an IC, an analog IC, an RFIC, a mixed-signal IC, an ASIC, a printed circuit board (PCB), an electronics device, etc. The complementary amplifier may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the complementary amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    an N-channel metal oxide semiconductor (NMOS) transistor configured to receive and amplify an input signal; and
    a P-channel metal oxide semiconductor (PMOS) transistor coupled to the NMOS transistor and configured to receive and amplify the input signal, the NMOS and PMOS transistors operating as a linear complementary amplifier and providing an output signal, the NMOS and PMOS transistors having dimensions selected to keep a total transconductance for the NMOS and PMOS transistors approximately constant over a range of the input signal.

2. The apparatus of claim 1, wherein the NMOS and PMOS transistors have separate bias voltages, and wherein a gate of the NMOS transistor is biased with a first bias voltage and a gate of the PMOS transistor is biased with a second bias voltage.

3. The apparatus of claim 1, wherein a gate of the NMOS transistor is biased with an external bias voltage and a gate of the PMOS transistor is self-biased.

4. The apparatus of claim 1, further comprising:
    a first resistor coupled to a gate of the NMOS transistor and configured to provide a bias voltage for the NMOS transistor; and
    a second resistor coupled between a gate and a drain of the PMOS transistor and configured to provide self bias for the PMOS transistor.

5. The apparatus of claim 1, wherein the NMOS and PMOS transistors are biased to overlap a low-to-high transition of transconductance of the NMOS transistor with a high-to-low transition of transconductance of the PMOS transistor.

6. The apparatus of claim 1, wherein the NMOS and PMOS transistors both operate in moderate inversion region for a range of voltages for the input signal.

7. The apparatus of claim 1, wherein the NMOS and PMOS transistors have approximately equal areas.

8. The apparatus of claim 1, wherein width and length dimensions of the NMOS and PMOS transistors are selected to obtain an approximately constant total input capacitance for the NMOS and PMOS transistors over a range of voltages for the input signal.

9. The apparatus of claim 1, wherein width and length dimensions of the NMOS and PMOS transistors are selected to match change in input capacitance of the NMOS transistor in moderate inversion region with change in input capacitance of the PMOS transistor in moderate inversion region.

10. The apparatus of claim 1, wherein sizes of the NMOS and PMOS transistors are selected to obtain an approximately constant total transconductance for the NMOS and PMOS transistors over a range of voltages for the input signal.

11. The apparatus of claim 1, wherein sizes of the NMOS and PMOS transistors are selected to match change in transconductance of the NMOS transistor in moderate inversion region with change in transconductance of the PMOS transistor in moderate inversion region.

12. The apparatus of claim 1, wherein the NMOS transistor have a first transconductance and a first size and the PMOS transistor have a second transconductance and a second size, the second size being M times the first size and M being select such that the second transconductance matches the first transconductance.

13. The apparatus of claim 1, further comprising:
    a second NMOS transistor configured to receive and amplify a second input signal; and
    a second PMOS transistor coupled to the second NMOS transistor and configured to receive and amplify the second input signal, the second NMOS and PMOS transistors providing a second output signal, the input signal and the second input signal forming a differential input signal, the output signal and the second output signal forming a differential output signal, the NMOS and PMOS transistors and the second NMOS and PMOS transistors operating as a differential linear complementary amplifier.

14. An integrated circuit comprising:
    an N-channel metal oxide semiconductor (NMOS) transistor configured to receive and amplify an input signal; and
    a P-channel metal oxide semiconductor (PMOS) transistor coupled to the NMOS transistor and configured to receive and amplify the input signal, the NMOS and PMOS transistors operating as a linear complementary amplifier and providing an output signal, the NMOS and PMOS transistors having dimensions selected to keep a total transconductance for the NMOS and PMOS transistors approximately constant over a range of the input signal.

15. The integrated circuit of claim 14, wherein the NMOS and PMOS transistors have separate bias voltages, and wherein a gate of the NMOS transistor is biased with a first bias voltage and a gate of the PMOS transistor is biased with a second bias voltage.

16. The integrated circuit of claim 14, wherein width and length dimensions of the NMOS and PMOS transistors are selected to match change in input capacitance of the NMOS transistor in moderate inversion region with change in input capacitance of the PMOS transistor in moderate inversion region.

17. The integrated circuit of claim 14, wherein sizes of the NMOS and PMOS transistors are selected to match change in transconductance of the NMOS transistor in moderate inversion region with change in transconductance of the PMOS transistor in moderate inversion region.

18. An integrated circuit comprising:
    a low noise amplifier (LNA) including
        an N-channel metal oxide semiconductor (NMOS) transistor configured to receive and amplify a radio frequency (RF) input signal; and
        a P-channel metal oxide semiconductor (PMOS) transistor coupled to the NMOS transistor and configured to receive and amplify the RF input signal, the NMOS and PMOS transistors operating as a linear complementary amplifier and providing an RF output signal, the NMOS and PMOS transistors having dimensions selected to keep a total transconductance for the NMOS and PMOS transistors approximately constant over a range of the input signal.

19. The integrated circuit of claim 18, wherein the LNA further includes
    a first resistor coupled to a gate of the NMOS transistor and configured to provide a first bias voltage for the NMOS transistor; and
    a second resistor coupled between a gate and a drain of the PMOS transistor and configured to provide a second bias voltage for the PMOS transistor.

20. A method comprising:
    amplifying an input signal with an N-channel metal oxide semiconductor (NMOS) transistor having a first transconductance;
    amplifying the input signal with a P-channel metal oxide semiconductor (PMOS) transistor having a second transconductance and coupled to the NMOS transistor; and
    providing an output signal at drains of the NMOS and PMOS transistors operating as a linear complementary amplifier, the NMOS and PMOS transistors having dimensions selected to keep a total transconductance for the NMOS and PMOS transistors approximately constant over a range of the input signal.

21. The method of claim 20, further comprising:
    biasing a gate of the NMOS transistor with a first bias voltage; and
    biasing a gate of the PMOS transistor with a second bias voltage.

22. The method of claim 20, further comprising:
    biasing the NMOS and PMOS transistors to overlap a low-to-high transition of the first transconductance of the NMOS transistor with a high-to-low transition of the second transconductance of the PMOS transistor.

23. An apparatus comprising:
    means for amplifying an input signal with an N-channel metal oxide semiconductor (NMOS) transistor having a first transconductance;
    means for amplifying the input signal with a P-channel metal oxide semiconductor (PMOS) transistor having a second transconductance and coupled to the NMOS transistor; and
    means for providing an output signal at drains of the NMOS and PMOS transistors operating as a linear complementary amplifier, the NMOS and PMOS transistors having dimensions selected to keep a total transconductance for the NMOS and PMOS transistors approximately constant over a range of the input signal.

24. The apparatus of claim 23, further comprising:
    means for biasing a gate of the NMOS transistor with a first bias voltage; and
    means for biasing a gate of the PMOS transistor with a second bias voltage.

25. The apparatus of claim 23, further comprising:
    means for biasing the NMOS and PMOS transistors to overlap a low-to-high transition of the first transconductance of the NMOS transistor with a high-to-low transition of the second transconductance of the PMOS transistor.

* * * * *